United States Patent [19]

Fernandez

[11] Patent Number: 4,638,237

[45] Date of Patent: Jan. 20, 1987

[54] BATTERY CONDITION INDICATOR

[75] Inventor: Emilio A. Fernandez, Fairfax County, Va.

[73] Assignee: Pulse Electronics, Inc., Rockville, Md.

[21] Appl. No.: 688,327

[22] Filed: Jan. 3, 1985

[51] Int. Cl.$^4$ .............................................. H02J 7/00
[52] U.S. Cl. .................................... 320/48; 320/43; 340/636; 324/433
[58] Field of Search ..................... 320/48, 43, 44, 39; 340/636; 324/433; 368/107

[56] References Cited

U.S. PATENT DOCUMENTS

| | | | |
|---|---|---|---|
| 4,153,867 | 5/1979 | Jungfer | 320/48 X |
| 4,455,523 | 6/1984 | Koenck | 320/48 X |
| 4,525,055 | 6/1985 | Yokoo | 320/48 X |

Primary Examiner—Patrick R. Salce
Assistant Examiner—Mark D. Simpson
Attorney, Agent, or Firm—C. Lamont Whitham

[57] ABSTRACT

A battery condition indicator provides an indication of both the charge used and the life remaining in a rechargeable battery. The time of use of the battery between charges is measured to provide an indirect measure of the charge remaining. The total time of service of the battery is measured to provide an indirect measure of the age or life of the battery.

8 Claims, 6 Drawing Figures

BATTERY CONDITION INDICATOR

BACKGROUND OF THE INVENTION

The subject invention is broadly directed to indicators for electric storage batteries which provide a visual indication of the life and charge of the battery, and more particularly the invention is directed to a battery condition indicator that is both inexpensive and capable of surviving very adverse conditions during the expected life of the battery.

The invention has its primary application in combination with an electric storage battery used to power railroad signalling equipment. Such equipment is subjected to severe mechanical and thermal shocks but must operate with high reliability. The battery in this particular application is detachably connected to a telemetering transmitter which is located at the rear of a train. Since the data transmitted is critical to the safe operation of the train, it is important that the battery be fresh and properly charged. It is of course well known that as batteries age, they become less reliable as a source of electrical power. This is usually manifested by a failure of the battery, and the condition is remedied by replacement of the battery. However, in critical applications such as railroad signalling, it is necessary to anticipate battery failure and replace the battery before the failure occurs. More commonly, it is known to provide some indication of the current state of the charge of the battery, and this is usually done by means of any number of well known instruments including voltmeters, ammeters and hygrometers.

One example of battery condition indicators known in the prior art is disclosed in U.S. Pat. No. 4,413,221 to Benjamin et al. This patent discloses a circuit for both determining the capacity of a battery while charging the battery and the state-of-charge of the battery by measuring the voltage level during a discharge interval. In this way, both short term and long term indications of the battery are provided. However, the Benjimin et al system is quite complex and not suitable to applications requiring rugged and inexpensive indicators.

U.S. Pat. Nos. 3,118,137 to Vincent, 4,027,231 to Lohrmann, and 3,778,702 to Finger each show different examples of battery charge indicators which provide an indication of the short term condition of the battery. U.S. Pat. Nos. 4,151,454 to Iida, 4,163,186 to Haley and 4,380,726 to Sado et al are representative of remaining service life indicators for electric storage batteries. Thus, although it is well known in the prior art to provide battery condition indicators which show the short term condition, i.e. charge, of the battery and the long term condition, i.e. life remaining or age, of the battery, what is needed is a simple and inexpensive way to provide indications of battery conditions which will survive in a hostile environment such as experienced in railroads.

SUMMARY OF THE INVENTION

It is therefore an object of the present invention to provide an indicator for an electric storage battery which will provide an indication of both the short term and long term condition of the battery.

It is another object of the invention to provide a battery condition indicator which is simple and inexpensive to produce and will reliably perform in a hostile environment.

According to the invention, there is provided circuitry integral with a storage battery that provides outputs to a charge used indicator and a life remaining or age indicator. The charge used indicator is a timer which times out after a predetermined period computed on a worst case set of conditions. This indicator provides a short term indication on the status of the battery and is checked by the user periodically to determine when the battery should be recharged. The life or age indicator is also a timer which essentially measures the age of the battery as a function of the time the battery is connected to supply power to a circuit. Alternatively, the life or age indicator may be a counter function to count the number of times the battery is recharged, there being some predetermined number of charge cycles allowed before the battery must be replaced. In either case, the life or age indicator would not be checked as often as the charge used indicator. Preferably, the life or age indicator would be checked each time the battery is charged. It will be recognized that neither of the indicators provide a direct measure of the condition being indicated; however, these indirect measures in terms of time and/or number of occurrences of certain events provide a reliable measure of the conditions sought to be measured. Moreover, by making indirect measurements in terms of time or number of events, the circuitry is greatly simplified and may be produced with commercially available integrated circuits that are capable of resisting extreme mechanical and thermal shocks.

While the invention is described in terms of a preferred embodiment in a specific application for railroad signalling equipment, it will be understood by those of ordinary skill in the art that the invention can be modified and used in other and different environments. The invention has advantages when used in any hostile environment which requires high reliability.

BRIEF DESCRIPTION OF THE DRAWINGS

The foregoing and other objects, advantages and aspects of the invention will be better understood from the following detailed description of a preferred embodiment of the invention with reference to the drawings, in which.

DETAILED DESCRIPTION OF A PREFERRED EMBODIMENT

Figure 1:
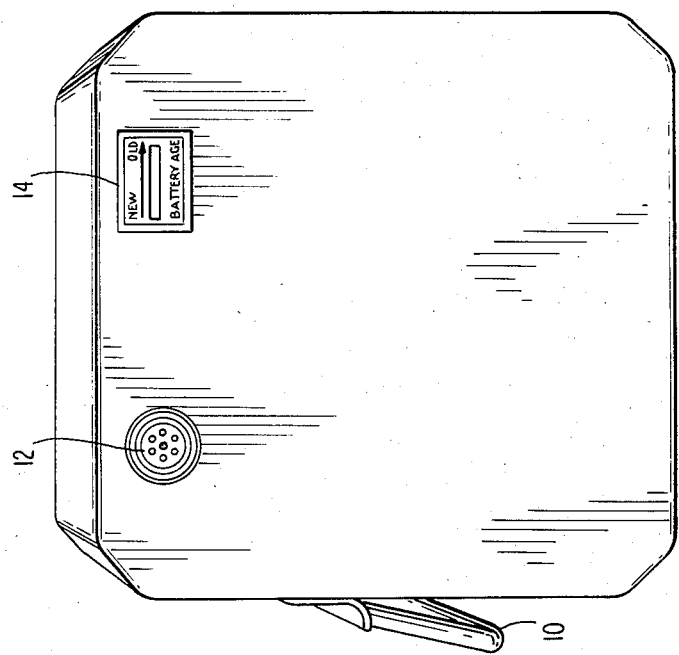
FIG. 1 is a front view of a battery pack showing the life remaining or age indicator according to the invention.

Referring now to the drawings and more particularly to FIG. 1 there is shown the front view of a rechargeable battery pack. On one side is a handle 10 which is provided for carrying the battery pack and the telemetry transmitter shown in FIG. 2 when it is attached to the battery pack. The battery pack is provided with a multipin connector 12 which mates with a similar connector on the telemetry transmitter or a connector on a battery charger. In addition, the battery pack is provided with a life remaining or age indicator 14 which is readily visible when service personnel connect the battery to a charger.

Figure 2:
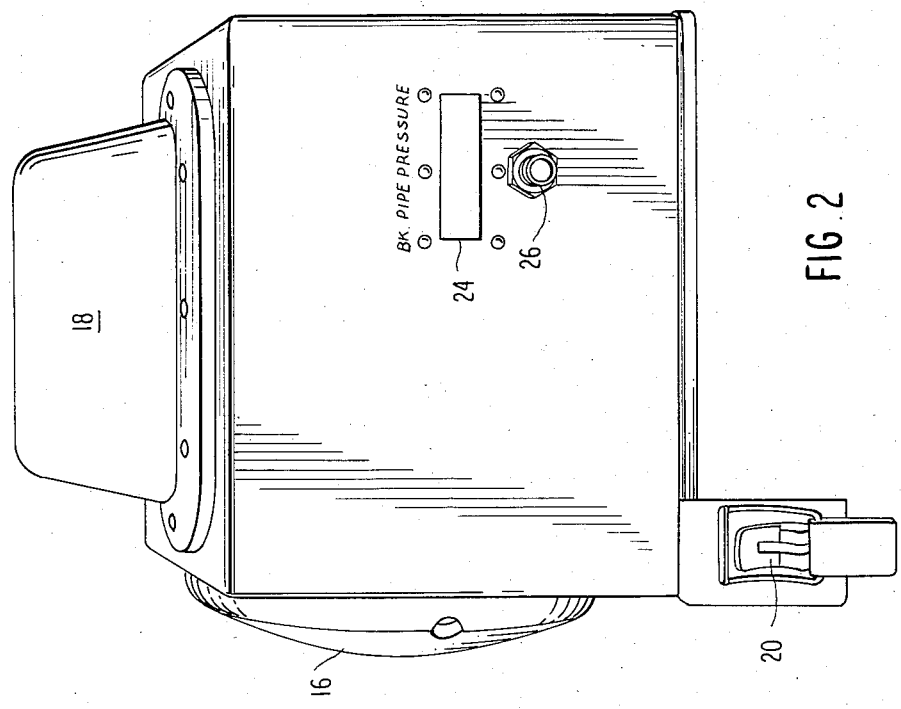
FIG. 2 is a side view of a railroad telemetering transmitter showing the current charge level indicator for a battery like that shown in FIG. 1.
Figure 3:
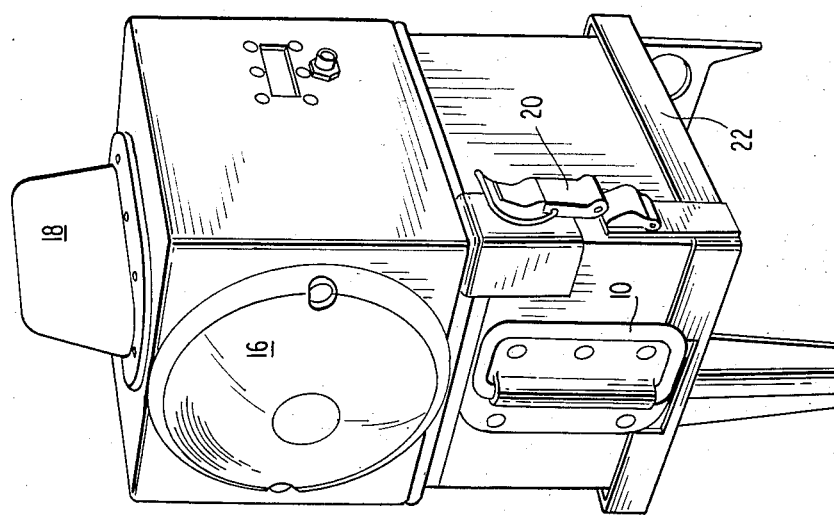
FIG. 3 is a perspective view of the battery shown in FIG. 1 and the telemetering transmitter shown in FIG. 2 connected together to form a single unit for mounting on a train coupler.

The telemetry transmitter shown in FIG. 2 is provided with a strobe light 16 on its rear face and a cover 18 for an antenna. The case of the telemetry transmitter is designed to be the same size as and mate with the battery pack shown in FIG. 1. To this end, there is provided a latch 20 that engages a hook attached to a frame 22 that carries the battery as shown in FIG. 3. Although only one latch is shown in FIGS. 2 and 3, it will be understood that two or more latches are provided to secure the telemetry transmitter to the battery and its supporting frame. As best shown in FIG. 2, the telemetry transmitter is provided with a light emitting diode (LED) display 24. Immediately below this display is a push button switch 26 which, when pushed, will provide a read out of the state of the battery charge. This display would be activated by pressing the switch 26 each time the telemetry package shown in FIG. 3 is attached to the last car of a train so as to confirm that the battery has sufficient charge for operating the transmitter. If the battery does not have sufficient charge, it is replaced with a battery that does have sufficient charge.

Figure 4:
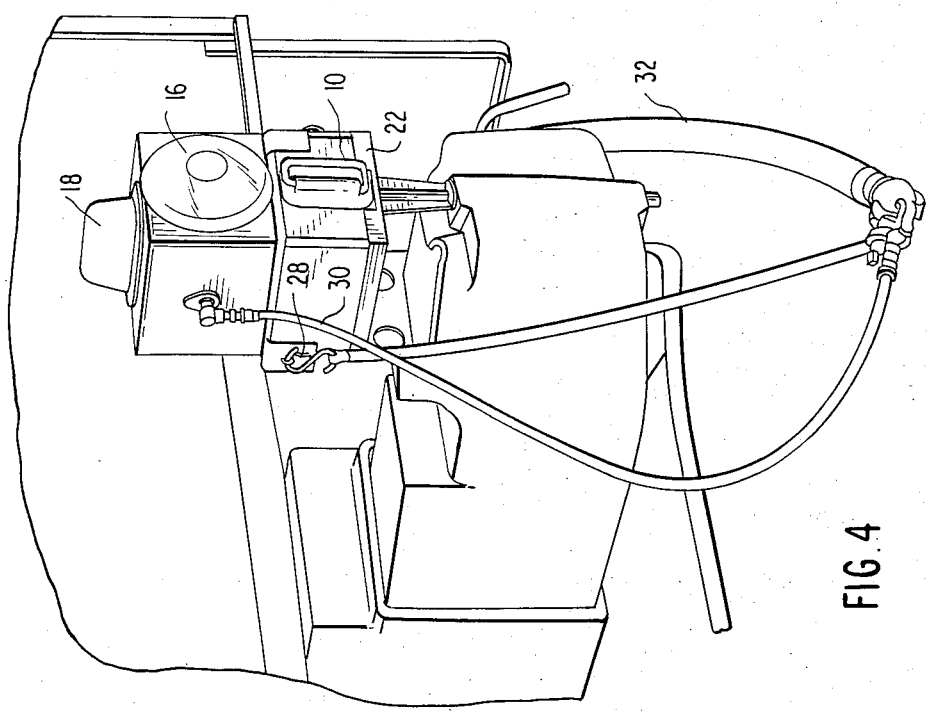
FIG. 4 is a perspective view of the unit shown in FIG. 3 attached to a train coupler.

The complete unit of battery, telemetry transmitter and frame are shown attached to the coupler of a train in FIG. 4. It can be observed in this figure that there is a second latch 28 for attaching the transmitter to the frame supporting the battery. Also, a hose 30 is connected to the air line 32 of the car and this hose is connected to a fitting 34 on one side of the telemetry transmitter. One of the conditions monitored by the telemetry transmitter is the pressure of this air line which supplies the required pressure for operating the brakes. As will be appreciated from FIGS. 3 and 4, when the complete unit is assembled, the front of the battery shown in FIG. 1 is covered by the telemetry transmitter. The life or age meter 14 is thereby covered and can only be read when the unit is disassembled in order to charge the battery. The meter 14 is thus covered and protected in service.

Figure 5:
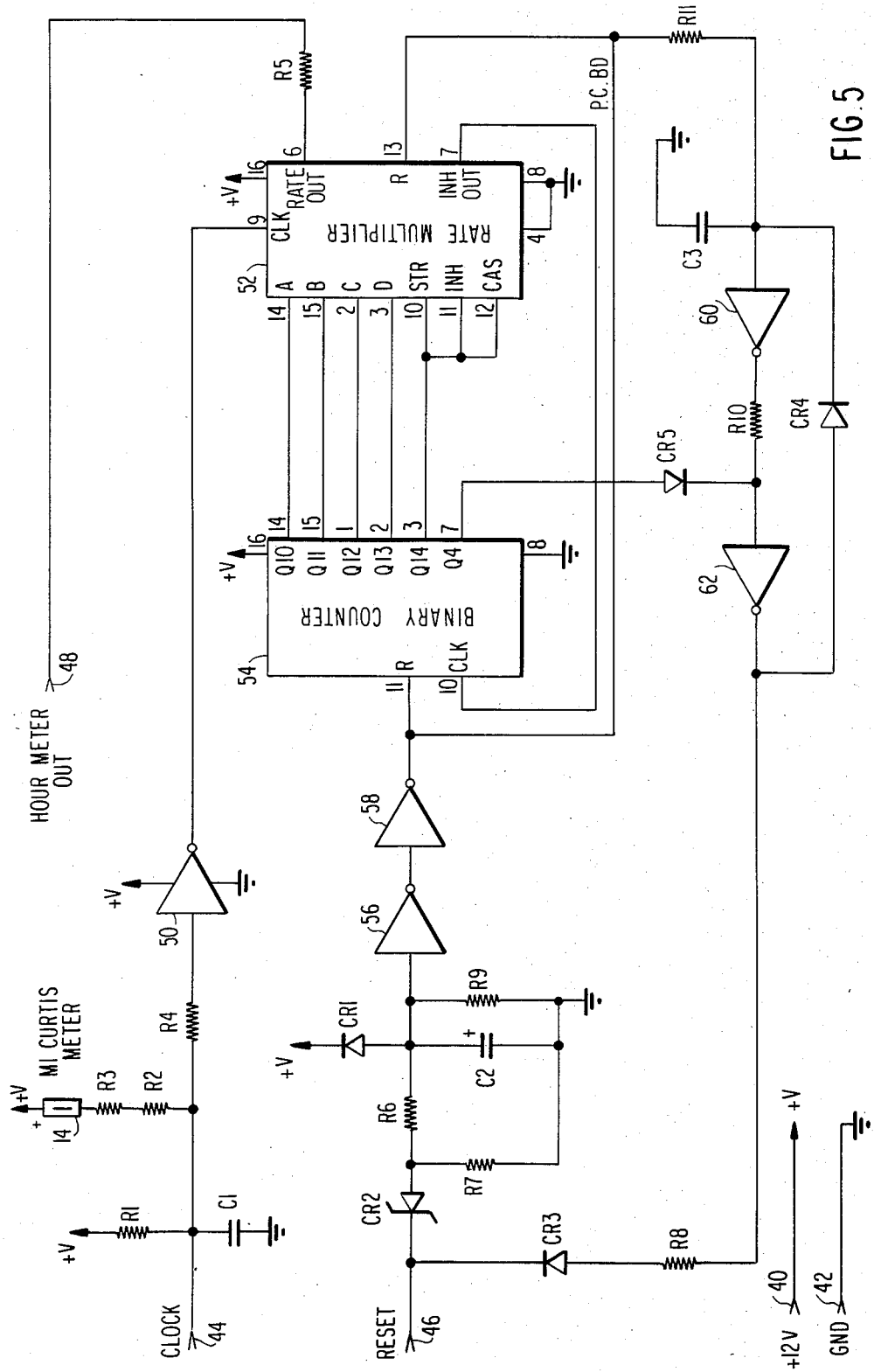
FIG. 5 is a schematic drawing of the circuitry for the life or age indicator and the charge used indicator according to the invention.

Turning now to FIG. 5, the multipin connector 12 is shown as having five pins 40, 42, 44, 46, and 48. Pins 40 and 42 provide the connections to the battery positive and negative terminals, respectively. Pin 44 is labeled the clock input and is connected to the input of an inverting Schmidt trigger 50 through a resistor R4. This pin is also connected to the life or age meter 14 through the series resistors R2 and R3. The other side of the meter 14 is directly connected to the positive terminal of the battery. In the preferred embodiment of the invention, the meter 14 is a commercially available meter having a column of mercury with a bubble within the column. The meter operates on an electrolysis principle which causes the bubble to slowly shift along the column as long as the meter is connected across a source of potential. In the case of the specific application described, the meter scale is marked off in a range of 0 to 100%.

The clock input is normally low when the battery pack is mated with the telemetry transmitter. Thus, the clock input appears as a ground connection to the meter 14 so that it measures the time the battery pack is connected to the transmitter. However, when the battery pack is disconnected from the transmitter, pin 44 rises to a voltage corresponding to the positive terminal voltage of the battery due to charging of capacitor C1 through resistor R1. This effectively "turns off" meter 14 so that it only measures the time the battery is actually connected to the transmitter.

The clock pulses are supplied to pin 44 by a microprocessor which is part of the telemetry transmitter circuits. The clock pulses are positive going and of short duration so as not to adversely affect the time measurement being made by the meter 14. In this regard, the capacitor C1 provides isolation from ground for the clock pulses. The Schmidt trigger inverter 50 not only inverts the positive going clock pulses to negative going clock pulses, it also performs the function of a wave shaper to provide a clean clock pulse input to the digital rate multiplier 52. The digital rate multiplier 52 and a binary counter 54 together form a large capacity counter for providing a measure of charge used by the battery. Both of these devices are commercially available CMOS devices manufactured by several semiconductor companies including National Semiconductor and Motorola. The binary rate multiplier is a CD4089 device and the binary counter is a CD4020 device.

After the battery has been charged, it is necessary to reset the counter to zero and this done by applying a high positive voltage for a relatively long duration to the reset pin 46. For example, if the battery is a 12 volt battery, the reset pulse would typically be about 25 volts in order to pass the Zener diode CR2. This prevents the counter from being reset by shorting the reset pin 46 to the pin 40. In addition, the resistor R6 and capacitor C2 constitute a low pass filter which prevents pulses of short duration from resetting the counter. Resistor R7 at the input of the low pass filter is a pull down resistor, and the resistor R9 at the output of the filter provides a high matching input resistance to the first of two Schmidt trigger inverters 56 and 58. The diode CR1 is a clamping diode to prevent a very high voltage reset pulse from damaging the Schmidt trigger 56. The two Schmidt triggers provide amplification and isolation between the reset pin 46 and the reset inputs of the rate multiplier 52 and the binary counter 54. These Schmidt triggers also provide a wave shaping function to generate a clean, positive going pulse of proper duration to the reset inputs of the rate multiplier 52 and the binary counter 54.

Two additional Schmidt trigger inverters 60 and 62 are connected so as to form a latch or flip-flop. More specifically, the output of Schmidt trigger inverter 60 is connected through resister R10 to the input of Schmidt trigger inverter 62, and the output of Schmidt trigger inverter 62 is connected to the input of Schmidt trigger inverter 60 through a diode CR4. The input of Schmidt trigger inverter 60 constitutes the reset or clear input for the flip-flop thus formed, and the input supplied via diode CR5 to Schmidt trigger 62 constitutes the set input for the flip-flop.

The flip-flop comprising the two Schmidt trigger inverters 60 and 62 provides an optional way of showing a state of substantially full charge on the battery. When the battery has been charged and the counter is reset to reflect this fact, the flip-flop is also reset. Note that the reset input to the flip-flop is connected to the reset output from Schmidt trigger inverter 58 through a low pass filter comprising resistor R11 and capacitor C3. This low pass filter insures that the reset pulse is of sufficient duration so as to avoid any accidental resetting of the flip-flop. The output of the flip-flop is connected via a resistor R8 and diode CR3 to pin 46. An optional LED indicator can be connected to this pin and, if the flip-flop is reset, the LED will light providing an indication that the battery has a full charge. Thus, the pin 46 provides both an input and an output connection, and the diodes CR3 and CR2 provide isolation between input and output functions.

In operation, the microprocessor generated clock pulses are supplied via the Schmidt trigger 50 to the clock input of the binary rate multiplier 52. Initially, every sixteenth clock pulse to the binary rate multiplier 52 produces an output on pin 7 of the binary rate multiplier. This pin is connected to the clock input of the binary counter 54. No output is produced by the binary rate multiplier 52 on its rate output pin 6 until there is a change in the inputs A, B, C, and/or D of the binary rate multiplier. These inputs change the multiplication rate of the binary rate multiplier. The inputs A, B, C, and D are directly connected to the Q10, Q11, Q12, and Q13 outputs, respectively, of the binary counter 54. These correspond to the $2^{10}$, $2^{11}$, $2^{12}$, and $2^{13}$ outputs, respectively, of the counter. Thus, the first of these outputs to change to a high state will be the Q10 output, and when this occurs, the binary rate multiplier will provide one pulse output on its rate out pin 6 for every sixteen clock pulses. Eventually, the Q11 output will go high and the Q10 output will go low causing the binary rate multiplier 52 to provide two output pulses for every sixteen clock pulses. Next, the Q10 output will go high again so that both it and the Q11 outputs are high at the same time. This causes the binary rate multiplier 52 to provide three output pulses for each sixteen clock pulses. The progression continues in binary fashion until each of the outputs Q10, Q11, Q12, and Q13 are high in which case the binary rate multiplier 52 provides sixteen output pulses for each sixteen clock pulses. An overflow condition is indicated by the output Q14 of the binary counter 54 going high. This output is directly connected to the inhibit input of the binary rate multiplier 52 to prevent any further operation of the counter.

At this point it will be noted that the set input to the flip-flop comprising the two Schmidt trigger inverters 60 and 62 is connected to the Q4 output of the binary counter 54. Thus, the flip-flop is set after $2^4$ times sixteen clock pulses or $2^8$ clock pulses. After this period of time the battery is no longer considered to be fully charged.

The rate output from the binary rate multiplier 52 is supplied through resistor R5 to pin 48 which is labeled hour meter out. This pin is connected to an input of the microprocessor in the telemetry transmitter, and the microprocessor is programmed to recognize the response on this pin as indicative of a certain amount of charge remaining. The clock pulses supplied to pin 44 may be considered as interrogation pulses, and the pulses supplied to pin 48 may be considered as response pulses. Thus, the microprocessor can recognize from the pattern of pulses produced by the binary rate multiplier in response to a group of sixteen clock pulses the level of charge remaining in the battery. This information is then used by the microprocessor to produce an output to energize the LED display 20 on the side of the transmitter. In the preferred application, this information may also be transmitted to a receiver unit in the locomotive cab.

One advantage of this procedure is that the microprocessor can change the rate of clock pulses to the counter depending on the load of the telemetry equipment. For example, when the strobe light 16 is activated at night by a photocell circuit, the microprocessor will recognize this fact and increase the repetition rate of the clock pulses to the counter thereby reflecting the greater current drain this strobe light represents.

Figure 6:
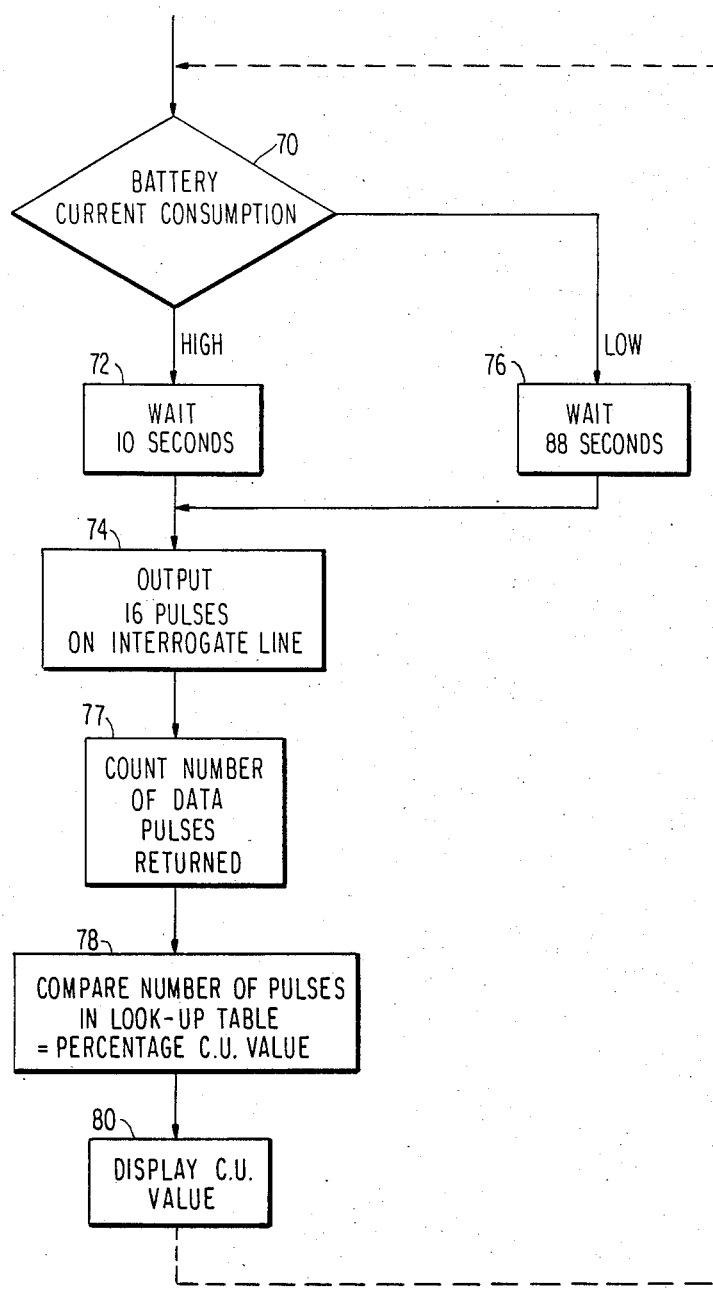
FIG. 6 is a flowchart showing the processing steps performed by a microprocessor for generating the output to the charge used indicator.

Referring now to FIG. 6, there is shown a flowchart showing the operation of the microprocessor in the telemetering transmitter circuit as it pertains to the subject invention. The first operation shown in the figure is a decision block 70 which determines if the battery current consumption is high or low. As just stated, battery consumption will be high when the strobe light 16 is on. When current consumption is high, the microprocessor waits 10 seconds as indicated by block 72 and then, in block 74, issues 16 pulses on the interrogate line. On the other hand, if the strobe light 16 is not on and therefore current consumption is low, the microprocessor waits 88 seconds, as indicated by block 76, before outputing the 16 interrogate pulses. In either case, the 16 interrogate pulses causes an output on pin 48 from the binary rate multiplier 52 shown in FIG. 5. These pulses are counted by the microprocessor in block 76. The number of pulses counted are compared in a look-up table to derive a charge used value, as indicated in block 78. This value is supplied to the LED display 24 for display as shown by block 80. It will be recalled that the actual display of this value does not occur until the test switch button 26 is depressed. The process then returns to the input of decision block 70.

While the invention has been described in terms of a specific preferred embodiment, those skilled in the art will recognize that the invention can be practiced in other and different environments and that modifications can be made to the circuitry and operation thereof without departing from the spirit and scope of the appended claims.

I claim:
1. A battery condition indicator for indicating both the charge used and the life remaining in a rechargeable battery comprising:
   rate multiplying and counting means for indirectly measuring the charge used by the battery between charges;
   means for supplying variable rate clock pulses to said rate multiplying and counting means, the rate of said clock pulses being a function of whether a high current consumption load is connected to the battery or not;
   timing means for measuring the total time in service of the battery;
   charge used display means responsive to said rate multiplying and counting means for providing an indication of the charge remaining in the battery; and
   age display means responsive to said timeing means for providing an indication of the life or age of the battery.
2. The battery condition indicator as recited in claim 1 wherein said means for supplying variable rate clock pulses to said rate multiplying and counting means generates clock pulses at a first predetermined rate if the load is not connected to the battery and at a second predetermined higher rate than said first predetermined rate if the load is connected to the battery.

3. The battery condition indicator as recited in claim 2 wherein said rate multiplying and counting means comprises:
   a rate multiplier connected to receive said clock pulses and provide a rate pulse output for integral numbers of said clock pulses and a clock pulse output, and
   a binary counter connected to said rate multiplier to count count pulses therefrom, said binary counter providing a binary count output to said rate multiplier for controlling the multiplication rate thereof as a function of the number of count pulses counted, said rate multiplier providing an output pulse rate indicative of the counted time period.

4. The battery condition indicator as recited in claim 3 wherein said rate multipling and counting means further comprises means responsive to the output pulse rate of said rate multiplier for determining a percent of charge used and supplying an output to said charged used display means.

5. The battery condition indicator as recited in claim 4 further comprising reset means for resetting said rate multiplying and counting means when said battery has been fully recharged.

6. The battery condition indicator as recited in claim 5 further comprising full charge indicating means connected to said reset means to be set thereby and further connected to said counting means to be reset thereby after a predetermined count has been accumulated in said counter means.

7. The battery condition indicator as recited in claim 2 wherein said timing means is responsive to the presence of said clock pulses for measuring the age of the battery as a function of the time the battery is connected to supply current, said timing means being disabled when said battery is disconnected.

8. The battery condition indicator as recited in claim 7 wherein said timing means and said age display means are an electrolysis time measuring device which provides a direct indication of the measured time.

* * * * *